United States Patent
Darabi et al.

(10) Patent No.: US 8,077,439 B2
(45) Date of Patent: Dec. 13, 2011

(54) METHOD AND SYSTEM FOR MITIGATING RISK OF ELECTROSTATIC DISCHARGE FOR A SYSTEM ON CHIP (SOC)

(75) Inventors: Hooman Darabi, Irvine, CA (US); Ming Wang Sze, Irvine, CA (US); Kent Oertle, Phoenix, AZ (US); Paul Chang, Ladera Ranch, CA (US)

(73) Assignee: Broadcom Corporation, Irvine, CA (US)

(*) Notice: Subject to any disclaimer, the term of this patent is extended or adjusted under 35 U.S.C. 154(b) by 280 days.

(21) Appl. No.: 12/265,601

(22) Filed: Nov. 5, 2008

(65) Prior Publication Data

US 2009/0262475 A1 Oct. 22, 2009

Related U.S. Application Data

(60) Provisional application No. 61/045,666, filed on Apr. 17, 2008.

(51) Int. Cl.
*H02H 9/00* (2006.01)
(52) U.S. Cl. .......... 361/56; 361/220; 361/781; 361/799
(58) Field of Classification Search .......... 361/56, 361/220, 781, 799
See application file for complete search history.

(56) References Cited

U.S. PATENT DOCUMENTS

| | | | | |
|---|---|---|---|---|
| 3,934,136 | A * | 1/1976 | Schoon | 250/214 R |
| 5,945,713 | A * | 8/1999 | Voldman | 257/355 |
| 6,934,136 | B2 * | 8/2005 | Duvvury | 361/56 |
| 2004/0168826 | A1 * | 9/2004 | Jiang et al. | 174/261 |
| 2005/0041347 | A1 * | 2/2005 | Khorram | 361/56 |
| 2006/0189189 | A1 * | 8/2006 | Jeon | 439/248 |
| 2007/0178766 | A1 * | 8/2007 | Banerjee et al. | 439/638 |
| 2008/0247115 | A1 * | 10/2008 | Lee et al. | 361/277 |
| 2009/0080135 | A1 * | 3/2009 | Major | 361/220 |
| 2009/0134902 | A1 * | 5/2009 | Law | 324/765 |
| 2009/0141466 | A1 * | 6/2009 | Liu et al. | 361/781 |
| 2010/0046131 | A1 * | 2/2010 | Moon et al. | 361/56 |

* cited by examiner

*Primary Examiner* — Patrick Salce
(74) *Attorney, Agent, or Firm* — McAndrews, Held & Malloy, Ltd.

(57) ABSTRACT

Aspects of a method and system for mitigating risk of electrostatic discharge in a system on chip are provided. In this regard, for an IC comprising a plurality of portions electrically isolated from one another within the IC, ESD current may be routed via one or more paths within and/or on a package to which the IC is bonded. The one or more paths may electrically couple two or more of the portions of the IC. The one or more paths may have low impedance at DC and high impedance at one or more frequencies utilized in the integrated circuit. One of the portions of the IC may be a ground plane for RF circuitry. One of the portions of the IC may be a ground plane for digital circuitry. The one or more paths may be fabricated in one or more metal layers of said package.

20 Claims, 8 Drawing Sheets ed circuit, in accordance with an embodiment of the invention.

METHOD AND SYSTEM FOR MITIGATING RISK OF ELECTROSTATIC DISCHARGE FOR A SYSTEM ON CHIP (SOC)

CROSS-REFERENCE TO RELATED APPLICATIONS/INCORPORATION BY REFERENCE

This patent application makes reference to, claims priority to and claims benefit from U.S. Provisional Patent Application Ser. No. 61/045,666, filed on Apr. 17, 2008.

The above stated application is hereby incorporated herein by reference in its entirety.

FIELD OF THE INVENTION

Certain embodiments of the invention relate to integrated circuits. More specifically, certain embodiments of the invention relate to a method and system for mitigating risk of electrostatic discharge in a system on chip (SoC).

BACKGROUND OF THE INVENTION

Electrostatic discharge (ESD) is the rapid transfer of electric charge between two objects. ESD often results from two objects of different electric potentials being brought into sufficient proximity of one another. An ESD event can critically and irreparably damage integrated circuits. For example, an ESD event may result in dielectric breakdown and/or fusing in one or more circuit elements, often resulting in permanently shorted and/or permanently open circuits. systems with some aspects of the present invention as set forth in the remainder of the present application with reference to the drawings.

BRIEF SUMMARY OF THE INVENTION

A system and/or method is provided mitigating risk of electrostatic discharge in a system on chip (SoC), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for mitigating risk of electrostatic discharge in a system on chip (SoC). In various exemplary embodiments of the invention, for an IC comprising a plurality of portions electrically isolated from one another within the IC, ESD current may be routed via one or more paths within and/or on a package to which the IC is bonded. The one or more paths may electrically couple two or more of the portions of the IC. The one or more paths may have low impedance at DC and high impedance at one or more frequencies utilized in the IC. One of the portions of the IC may be a ground plane for RF circuitry. One of the portions of the IC may be a ground plane for digital circuitry. The one or more paths may be selected based on the one or more frequencies utilized in the IC. The one or more paths may be selected based on a maximum tolerable resistance of the one or more paths. The maximum tolerable resistance may be determined based on a minimum voltage and/or current which the packaged integrated circuit may be expected to tolerate without damage. The one or more paths may be selected based on a minimum tolerable inductance of the one or more paths. The minimum tolerable inductance may be determined based on the one or more frequencies utilized in the integrated circuit. The one or more paths may comprise one or more turns. The one or more paths may be fabricated in one or more metal layers of the IC package.

Figure 1A:
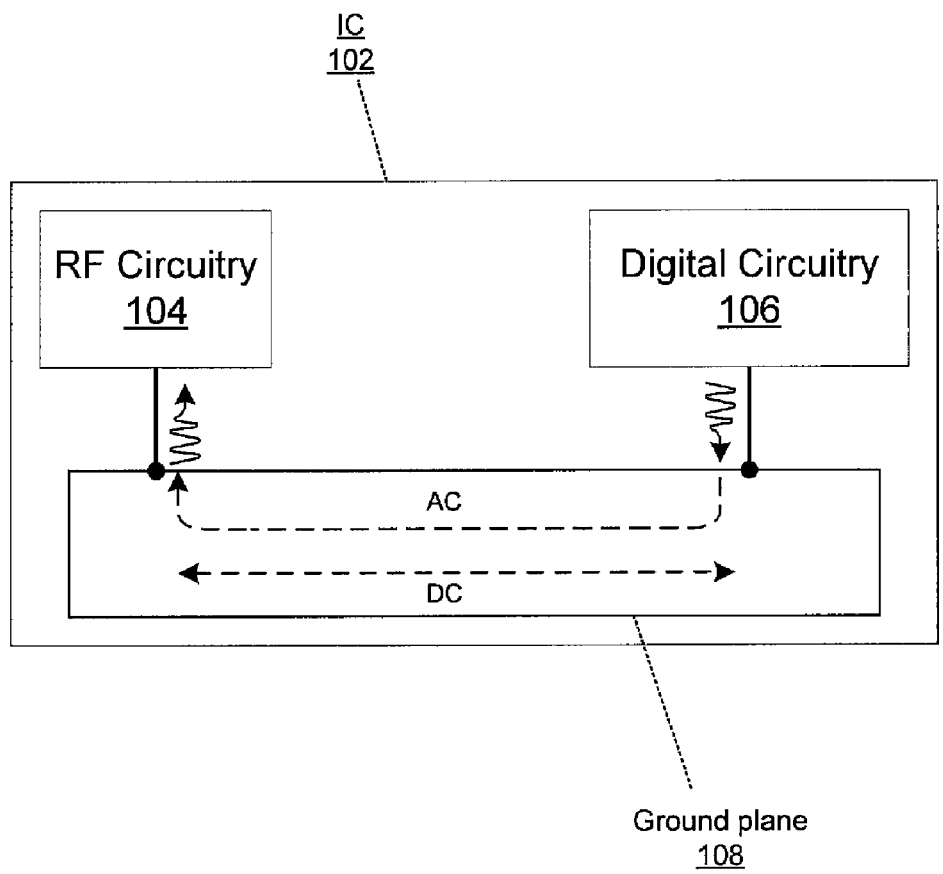
FIG. 1A is a diagram illustrating an exemplary integrated circuit, in connection with an embodiment of the invention.

FIG. 1A is diagram illustrating an exemplary integrated circuit, in connection with an embodiment of the invention. Referring to FIG. 1A, the integrated circuit (IC) 102 may comprise an RF portion 104 and a digital portion 106 which share a ground plane 108.

The RF portion 104 may comprise suitable logic, circuitry, and/or code that may be operable to process analog signals. In various exemplary embodiments of the invention, the RF portion 104 may comprise one or more amplifiers, mixers, filters, and analog to digital converters.

The digital portion 106 may comprise suitable logic, circuitry, and/or code that may be operable to process digital signals. In various exemplary embodiments of the invention, the digital portion 106 may comprise one or more baseband processors, digital signal processors (DSP), and memory elements.

In operation, the digital circuitry 106 may switch rapidly between at or near a negative voltage rail and at or near a positive voltage rail. This behavior may provide substantial noise margin for the digital circuitry 106, but the sharp signal transitions of the digital circuitry 106 may also generate significant amounts of noise. Consequently, the RF circuitry 104, which may be more susceptible to noise due, for example, to low signal amplitudes, may be negatively impacted by the noise from the digital circuitry 106. In this regard, noise from the digital circuitry 106 may be coupled into the RF circuitry 104 via the ground plane 108.

Figure 1B:
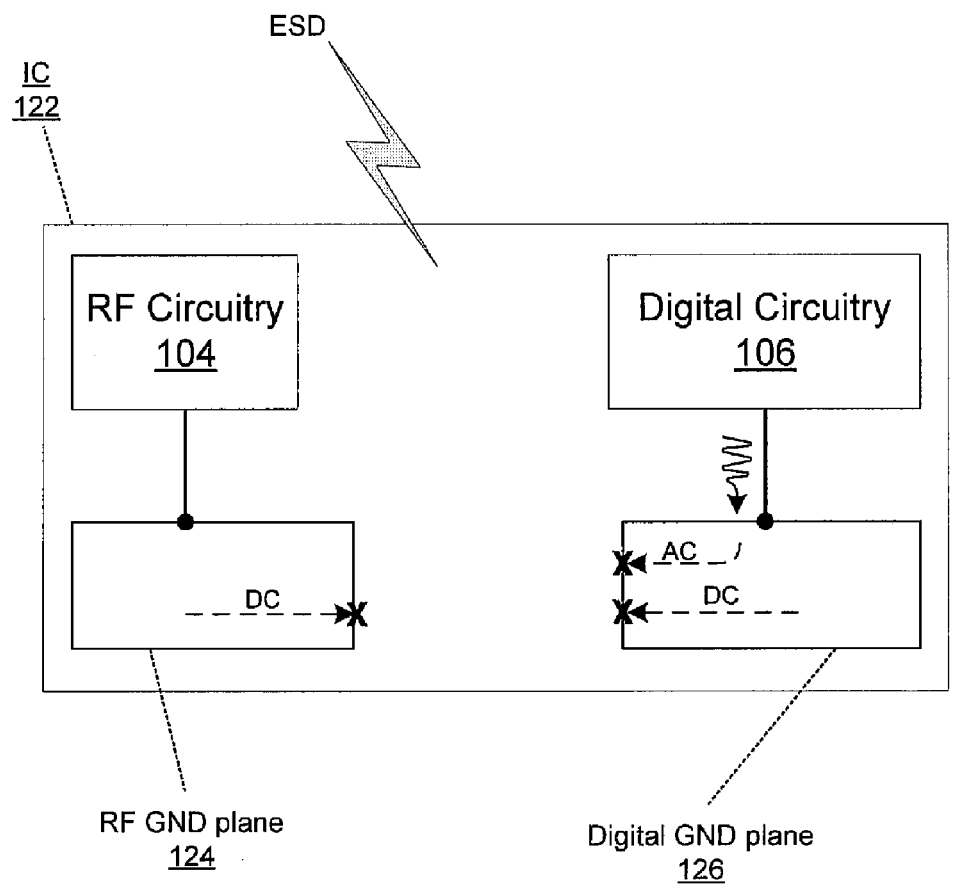
FIG. 1B is a diagram illustrating an exemplary integrated circuit, in connection with an embodiment of the invention.

FIG. 1B is a diagram illustrating an exemplary integrated circuit, in connection with an embodiment of the invention. Referring to FIG. 1B, the IC 122 may comprise an RF portion 104, a digital portion 106, an RF ground plane 124, and a digital ground plane 126.

The IC 122 may be similar to the IC 102 described with respect to FIG. 1A with the difference being that the common ground 108 of the IC 102 may be replaced with separate ground planes 124 and 126 for the RF portion 104 and the digital portion 106, respectively.

In operation, the electrical isolation between the RF ground plane 124 and the digital ground plane 126 may reduce the amount of noise coupled from the digital portion 106 to the RF portion 104. However, the electrical isolation between the RF ground plane 124 and the digital ground plane 126 may result in a voltage differential arising between separate portions of the IC 122 and/or between portions of the IC 122 and external circuits and/or objects. Accordingly, the IC 122 may be more susceptible to an ESD event than the IC 102 of FIG. 1A.

Figure 1C:
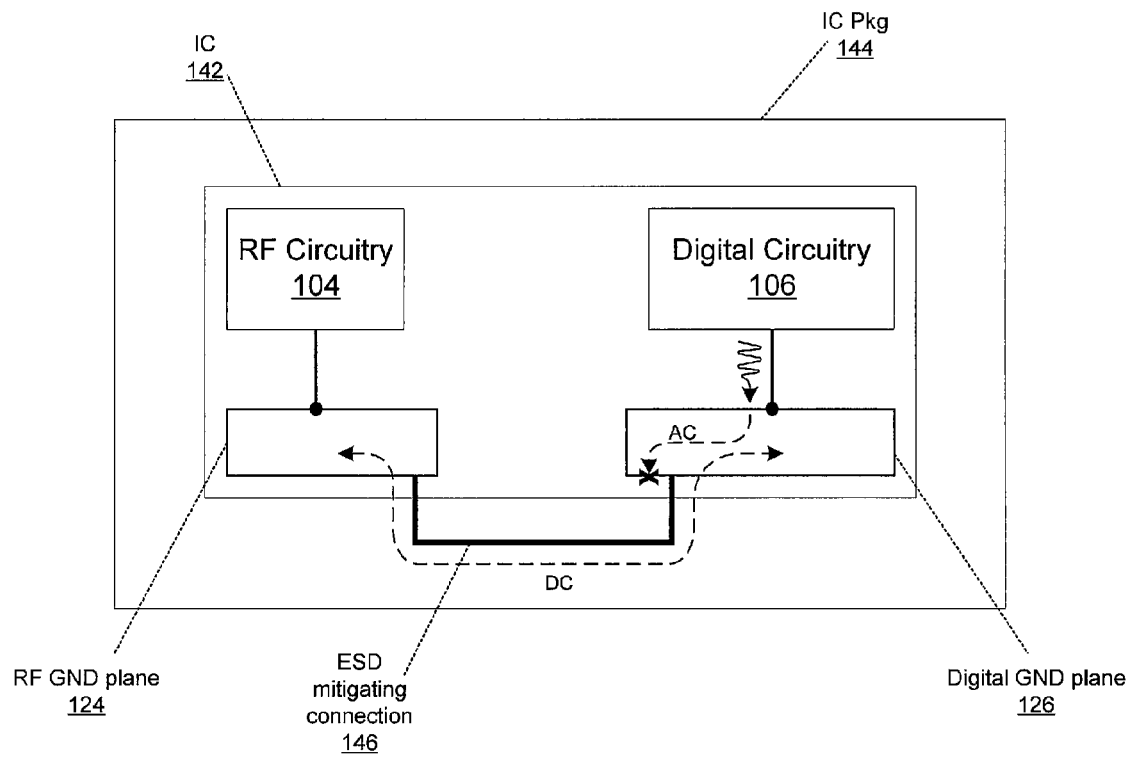
FIG. 1C is a diagram of an exemplary integrated circuit, in accordance with an embodiment of the invention.

FIG. 1C is a diagram of an exemplary integrated circuit, in accordance with an embodiment of the invention. Referring to FIG. 1C, there is shown an IC 142, bonded to an IC package 144. The IC 142 may be similar to the IC 122 described with respect to FIG. 1B, with the difference being that the RF ground plane 124 and the digital ground plane 126 in the IC 142 may be electrically coupled via an ESD risk mitigating connection 146 within and/or on the IC package 144.

In operation, the connection 146 may provide a low impedance DC path between the RF ground plane 124 and the digital ground plane 126 while simultaneously providing a high impedance AC path between the RF ground plane 124 and the digital ground plane 126. The low DC impedance of the connection 146 may prevent or reduce a difference in electric potential which may develop between separate portions of the IC 142 and/or between portions of the IC 142 and external circuits and/or objects. The high AC impedance of the connection 146 may prevent or reduce noise coupled between the RF portion 104 and the digital portion 106.

Fabricating the connection 146 in the IC package 144 may enable efficiently realizing a relatively high inductance and low resistance. In this regard, realizing the connection 146 in the IC package 144 may be less costly, in terms of space and/or dollars, than implementing the connection 146 on-chip or as an external component. Additionally, fabricating the connection 146 in the IC package 144 may enable tighter control of tolerances as compared to, for example, a discrete component. Furthermore, fabricating the connection in the IC package 144 may prevent the need to have two pins of the package 144 dedicated for coupling the RF ground plane 124 and the digital ground plane 126 externally.

Although FIG. 1C depicts the connection 146 electrically coupling an RF ground 124 and a digital ground plane 126, the invention is not so limited. In this regard, the connection 146 may be utilized to electrically couple any two portions of an integrated circuit between which low DC impedance and high AC impedance may be desirable.

Figure 2A:
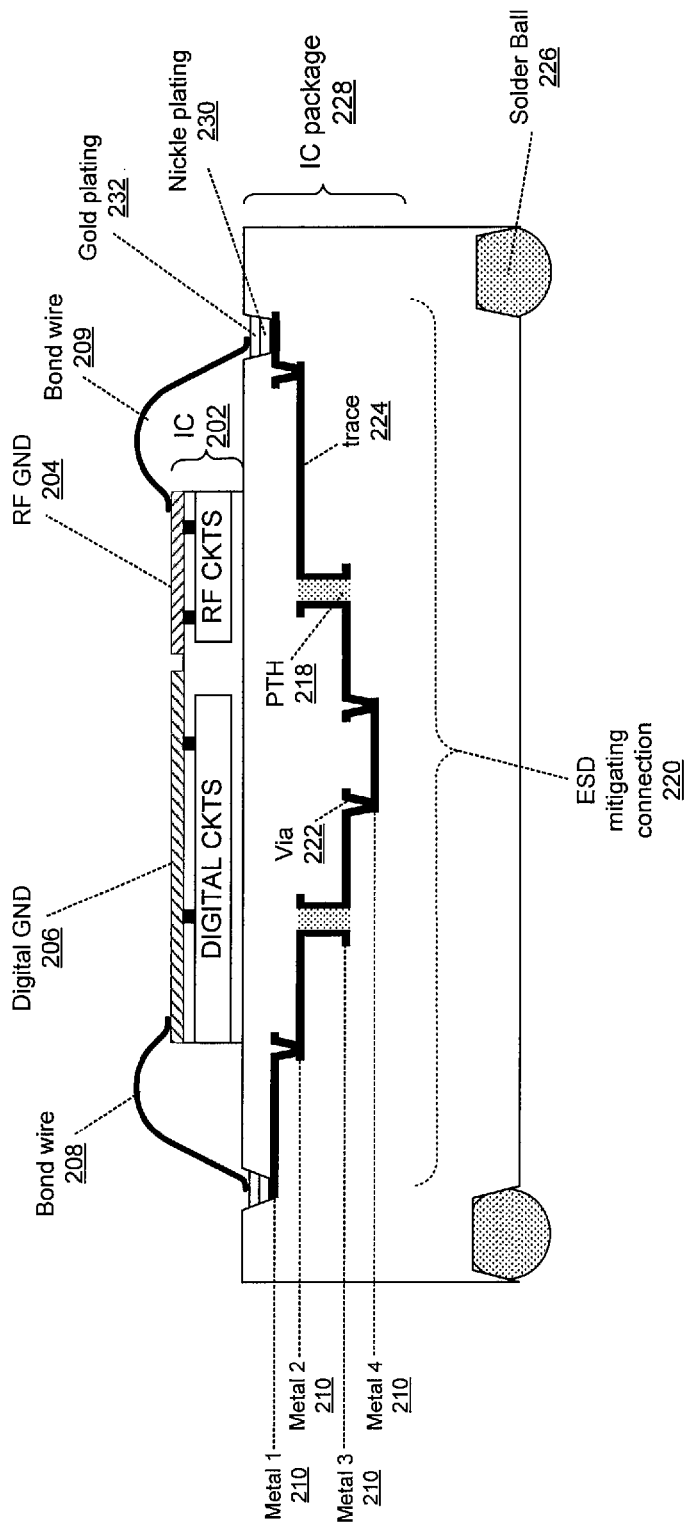
FIG. 2A illustrates a cross section of an exemplary IC bonded to a package comprising a connection for mitigating the risk of an ESD event, in accordance with an embodiment of the invention.

FIG. 2A illustrates a cross section of an exemplary IC bonded to a package comprising a connection for mitigating the risk of an ESD event, in accordance with an embodiment of the invention. Referring to FIG. 2A there is shown an IC 202 comprising an RF ground plane 204 and a digital ground plane 206. The IC 202 may be bonded to an IC package 228 via a plurality of bond wires 208. The bond wires 208 may be coupled to one or more metal layers 210 of the IC package 228 by a layer of nickel plating 230 and a layer of gold plating 232. The various metal layers 210 may be interconnected by one or more vias 222 and/or plated through holes (PTH) 218. The IC package 228 may be communicatively coupled to one or more external components by one or more solder balls 226. The RF ground plane 204 and the digital ground plane 206 may be electrically coupled by an ESD mitigating connection 220 realized in one or more of the metal layers 210. The ESD mitigating connection 220 may comprise one or more bond wires 208, vias 222, plated through holes 218, and/or traces 224 in the metal layers 210

The IC 202 may be similar to or the same as the IC 142 described with respect to FIG. 1C. The RF ground plane 204 may be similar to or the same as the RF ground plane 124 described with respect to FIGS. 1A-1C. The digital ground plane 206 may be similar to or the same as the digital ground plane 126 described with respect to FIGS. 1A-1C. The IC package 228 may be similar to or the same as the IC package 144 described with respect to FIG. 1C. Although, the package 228 comprises four metal layers, the invention is not so limited and any number of metal layers may be present in the IC package.

In operation, the inductance of the connection 220 may provide noise isolation between the RF ground plane 204 and the digital ground plane 206. Fabricating the connection 220 in the IC package 228, as opposed to in the IC 202, may enable a higher inductance connection and may thus improve noise isolation between RF circuitry and digital circuitry. Additionally, placing the connection 220 in the package 228 may enable the connection 220 to be physically closer to, for example, chassis or earth ground. In this regard, in the event of an ESD event, large currents may be diverted away from the IC 202.

In the exemplary embodiment of the invention depicted in FIG. 2A, the connection 220 comprises a single path from the digital GND 206 to the RF GND 294, however the invention is not so limited. In this regard, the connection 220 may comprise a plurality of paths which may be realized in the one or more metal layers 210 of the IC package 228. Additionally, in various embodiments of the invention, the paths may be selected via more switching elements (not shown) in the IC 202 and/or within and/or on the package 228. Selecting different paths may enable configuring an inductance and/or resistance of the connection 220. Accordingly, the paths may be configured to adjust the inductance and/or resistance of the connection 220 based on one or more frequencies utilized by one or more circuits of the IC 202.

Figure 2B:
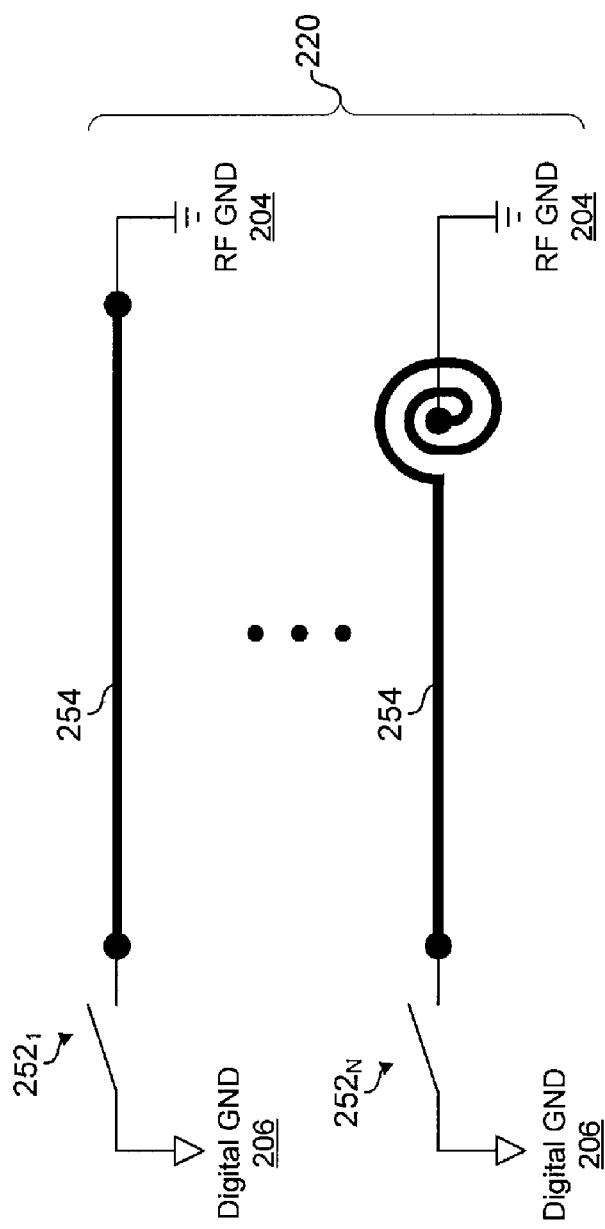
FIG. 2B is a diagram illustrating an ESD mitigating connection comprising a plurality of paths selectable via one or more switching elements, in accordance with an embodiment of the invention.

FIG. 2B is a diagram illustrating an ESD mitigating connection comprising a plurality of paths selectable via one or more switching elements, in accordance with an embodiment of the invention. Referring to FIG. 2B there is shown an ESD connection 220 comprising paths $254_1, \ldots, 254_N$. A first end of each of the paths 254 may be coupled to the digital GND 206 via a switch 252. A second end of each of the paths 254 may be coupled to the RF GND 206. Each of the paths $254_1, \ldots, 254_N$ may comprise, for example, one or more bond wires, one or more vias in the IC or the package, one or more PTH in the IC package, and/or one or more traces in the metal layers of the IC package.

In operation, the switches $252_1, \ldots, 252_N$ may be configured to select one or more of the paths $254_1, \ldots, 254_N$. In this regard, the inductance and/or resistance of the connection 220 may vary based on the configuration of the switches $252_1, \ldots, 252_N$. In various exemplary embodiments of the invention, one or more of the paths $254_1, \ldots, 254_N$ may be selected based on a mode of operation of the IC. In various exemplary embodiments of the invention, one or more of the paths $254_1, \ldots, 254_N$ may be selected based on a desired inductance and/or resistance of the connection 220. For example, the paths may be configured based on a maximum tolerable resistance of the connection 220 which may provide acceptable ESD protection and/or based on a minimum tolerable inductance of the connection 220 which may provide acceptable noise isolation. In regards to ESD, the maximum resistance may be determined based on, for example, a minimum transient voltage and/or current which the IC 202 may be expected to withstand. In regards to noise, frequencies utilized within the IC 202 may determine sensitive and/or noisy frequencies.

Figure 3:
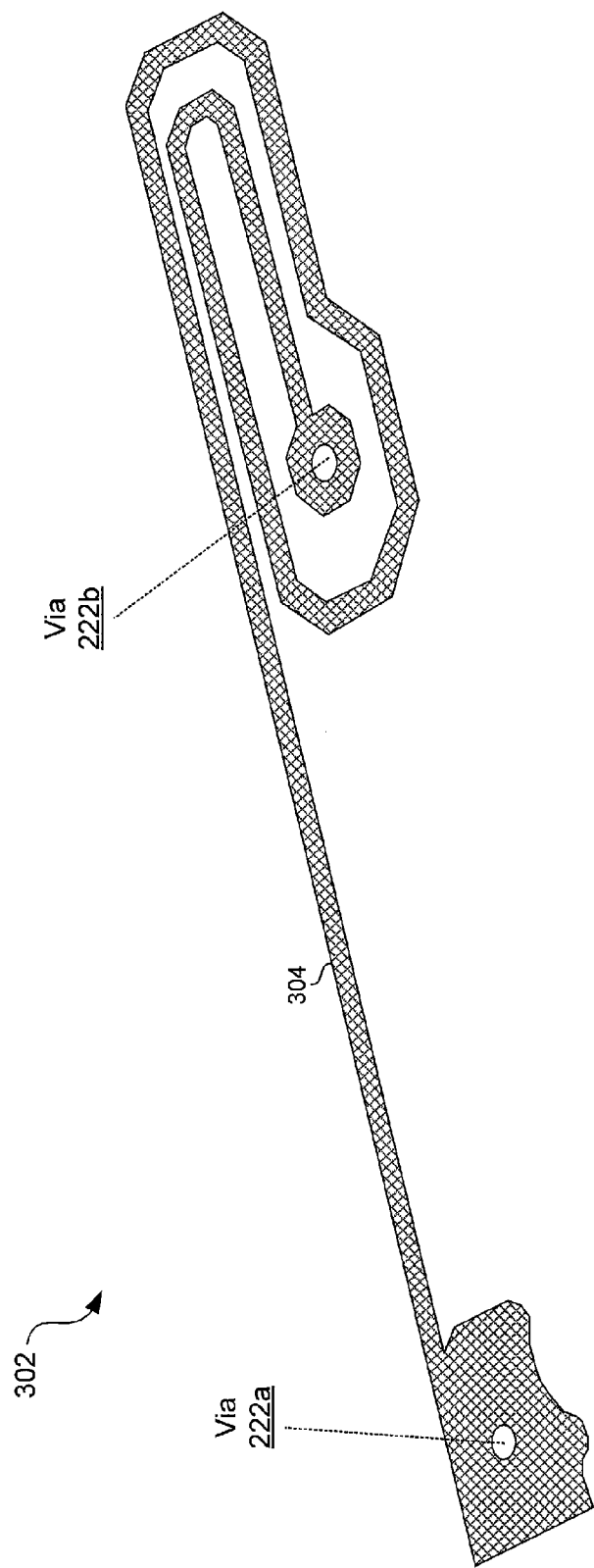
FIG. 3 illustrates an exemplary layout of a path in an IC package for electrically coupling two portions of an IC to mitigate ESD risk, in accordance with an embodiment of the invention.

FIG. 3 illustrates an exemplary layout of a path in an IC package for electrically coupling two portions of an IC to mitigate ESD risk, in accordance with an embodiment of the invention. Referring to FIG. 3, the path 302 may comprise an exemplary realization of the connection 220 described with respect to FIG. 2. In various embodiments of the invention, the path 302 may be the sole path of an ESD mitigating connection or may be one or a plurality of paths of an ESD mitigating connection. Although the exemplary path 302 comprises a single trace 304, via 222a, and via 222b, the invention is not so limited. For example, other exemplary paths may comprise other components such as additional traces, one or more plated through holes, additional vias, and/or one or more bond wires or solder bumps. In this regard, a size, a shape, and/or components of the path 302 may be based on desired inductance, capacitance, and/or resistance of the path 302. Additionally, the size, shape, and/or components of the path 302 may be based on available space in an IC package in which the path 302 is fabricated. In various embodiments of the invention, the path 302 may comprise one or more turns to increase its inductance.

Figure 4:
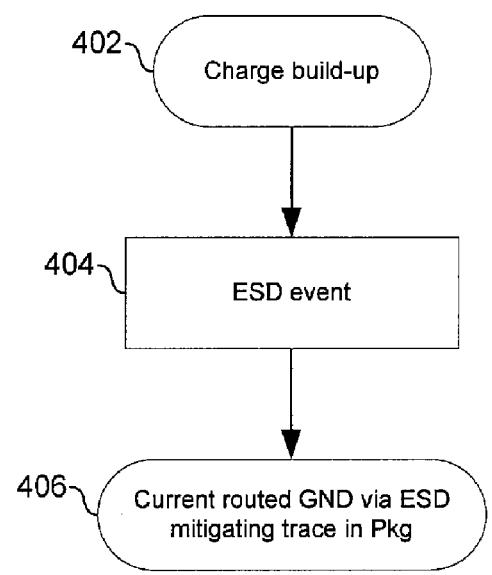
FIG. 4 is a flow chart illustrating mitigation of an ESD event via a connection in an IC package, in accordance with an embodiment of the invention.

FIG. 4 is a flow chart illustrating mitigation of an ESD event via a connection in an IC package, in accordance with an embodiment of the invention. Referring to FIG. 4, the exemplary steps may begin with step 402 when a charge imbalance may develop between a packaged IC and its surroundings. Subsequent to step 402, the exemplary steps may advance to step 404. In step 404, an electrostatic discharge may occur when the IC package touches it surroundings or when the imbalance becomes large enough to arc. The ESD may suddenly cause a large amount of current to flow between the surroundings and the IC as the charge seeks a ground path. Subsequent to step 404, the exemplary steps may advance to step 406. In step 406, the ESD current may be routed to ground via an ESD mitigating connection fabricated in the IC package. In this manner, the ESD current may be routed to ground without traversing and/or damaging the IC.

Figure 5:
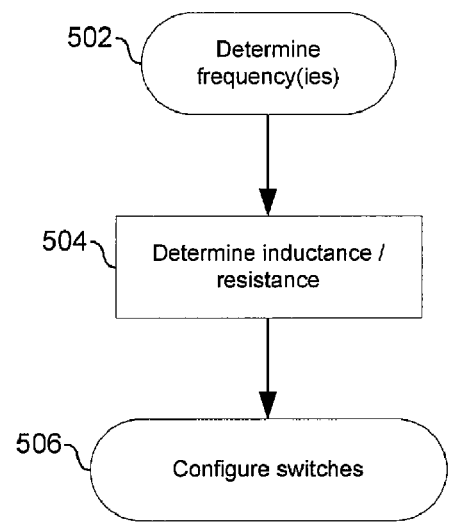
FIG. 5 is a flow chart illustrating exemplary steps for selecting one or more paths for an ESD mitigating connection, in accordance with an embodiment of the invention.

FIG. 5 is a flow chart illustrating exemplary steps for selecting one or more paths for an ESD mitigating connection, in accordance with an embodiment of the invention. Referring to FIG. 5, the exemplary steps may begin with step 502 when one or more frequencies utilized in an IC may be measured and/or otherwise determined. Subsequent to step 502, the exemplary steps may advance to step 504. In step 504, a desired inductance and/or resistance of an ESD mitigating connection may be determined based on the frequencies determined in step 502. Subsequent to step 504, the exemplary steps may advance to step 506. In step 506, one or more switches, such as the switches 252 described with respect to FIG. 2B, may be configured to select one or more paths to achieve (within a tolerance) the inductance and/or resistance determined in step 504.

Exemplary aspects of a method and system for mitigating risk of electrostatic discharge in a system on chip are provided. In an exemplary embodiment of the invention, for an IC 202 comprising a plurality of portions electrically isolated from one another within the IC, ESD current may be routed via one or more paths 254 within and/or on a package 228 to which the IC 202 is bonded. The one or more paths 254 may electrically couple two or more of the portions of the IC. The one or more paths 254 may have low impedance at DC and high impedance at one or more frequencies utilized in the IC 202. One of the portions of the IC 202 may be a ground plane 204 for RF circuitry. One of the portions of the IC may be a ground plane 206 for digital circuitry. The one or more paths 254 may be selected based on the one or more frequencies utilized in the IC 202. The one or more paths 254 may be selected based on a maximum tolerable resistance of the one or more paths 254. The maximum tolerable resistance may be determined based on a minimum voltage and/or current which the packaged integrated circuit may be expected to tolerate without damage. The one or more paths 254 may be selected based on a minimum tolerable inductance of the one or more paths 254. The minimum tolerable inductance may be determined based on the one or more frequencies utilized in the integrated circuit 202. The one or more paths 254 may comprise one or more turns. The one or more paths 254 may be fabricated in one or more metal layers 210 of the package 228.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for mitigating risk of electrostatic discharge in a system on chip.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for controlling electrostatic discharge, the method comprising:
   in an integrated circuit comprising a plurality of portions electrically isolated from one another within said integrated circuit:
      routing ESD current via one or more of a plurality of paths within and/or on a package to which said integrated circuit is bonded, wherein said integrated circuit comprises one or more switching elements that are configurable during operation of said integrated circuit to select, during operation of said integrated circuit, one or more of said plurality of paths, and wherein said selected one or more of said plurality of paths:
- electrically couple two or more of said plurality of portions; and
- are characterized by low impedance at DC and high impedance at one or more frequencies utilized by circuits within said integrated circuit.

2. The method according to claim 1, wherein one of said plurality of portions is a ground plane for RF circuitry within said integrated circuit.

3. The method according to claim 1, wherein one of said plurality of portions is a ground plane for digital circuitry within said integrated circuit.

4. The method according to claim 1, comprising selecting said one or more of said plurality of paths via one or more switching elements based on said one or more frequencies utilized in said integrated circuit.

5. The method according to claim 1, comprising selecting said one or more of said plurality of paths via one or more switching elements based on a maximum tolerable resistance of said one or more paths.

6. The method according to claim 5, comprising determining said maximum tolerable resistance based on a minimum voltage and/or current which the packaged integrated circuit is expected to tolerate without damage.

7. The method according to claim 1, comprising selecting said one or more of said plurality of paths via one or more switching elements based on a minimum tolerable inductance of said one or more paths.

8. The method according to claim 7, comprising determining said minimum tolerable inductance based on said one or more frequencies utilized in said integrated circuit.

9. The method according to claim 1, wherein said selected one or more of said plurality of paths comprise one or more turns.

10. The method according to claim 1, wherein said plurality of paths are fabricated in one or more metal layers of said package.

11. A system for controlling electrostatic discharge, the system comprising:
- a plurality of paths within and/or on an integrated circuit package bonded to an integrated circuit, said integrated circuit comprising a plurality of portions electrically isolated from one another within said integrated circuit, wherein said integrated circuit comprises one or more switching elements that are configurable during operation of said integrated circuit to select, during operation of said integrated circuit, one or more of said plurality of paths, and wherein said selected one or more of said plurality of paths:
- route ESD current;
- electrically couple two or more of said plurality of portions; and
- are characterized by low impedance at DC and high impedance at one or more frequencies utilized by circuits within said integrated circuit.

12. The system according to claim 11, wherein a first of said plurality of portions is a ground plane for RF circuitry of said integrated circuit.

13. The system according to claim 11, wherein a second of said plurality of portions is a ground plane for digital circuitry of said integrated circuit.

14. The system according to claim 11, wherein a size, shape, and/or number of said one or more of said plurality of paths is based on a frequency of operation of one or more portions of said integrated circuit.

15. The system according to claim 11, wherein a size, shape, and/or number of said one or more of said plurality of paths is based on a maximum tolerable resistance of said one or more paths.

16. The system according to claim 15, wherein said maximum tolerable resistance is based on a minimum voltage and/or current which the packaged integrated circuit is expected to tolerate without damage.

17. The system according to claim 11, wherein a size, shape, and/or number of said one or more of said plurality of paths is based on a minimum tolerable inductance of said one or more paths.

18. The system according to claim 17, wherein said minimum tolerable inductance is based on frequencies utilized in said integrated circuit.

19. The system according to claim 11, wherein said selected one or more of said plurality of paths comprise one or more turns.

20. The system according to claim 11, wherein said plurality of paths are fabricated in one or more metal layers of said integrated circuit package.

* * * * *